United States Patent
Wang

(10) Patent No.: US 9,091,711 B1
(45) Date of Patent: Jul. 28, 2015

(54) WIDE-RANGE FAST-LOCK FREQUENCY ACQUISITION FOR CLOCK AND DATA RECOVERY

(71) Applicant: PMC-SIERRA US, INC., Sunnyvale, CA (US)

(72) Inventor: Nanyan Wang, Coquitlam (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 81 days.

(21) Appl. No.: 13/945,596

(22) Filed: Jul. 18, 2013

(51) Int. Cl.
*G01R 23/02* (2006.01)
*H03L 7/06* (2006.01)

(52) U.S. Cl.
CPC . *G01R 23/02* (2013.01); *H03L 7/06* (2013.01)

(58) Field of Classification Search
USPC .......................... 375/359, 355, 373, 375, 376
See application file for complete search history.

(56) References Cited

U.S. PATENT DOCUMENTS

| | | | |
|---|---|---|---|
| 6,331,792 B1 | 12/2001 | Tonietto | |
| 6,856,206 B1 | 2/2005 | Perrott | |
| 7,558,342 B2 | 7/2009 | Meltzer | |
| 7,936,853 B2 | 5/2011 | Pang et al. | |
| 8,284,888 B2 | 10/2012 | Kyles | |
| 8,351,559 B1 | 1/2013 | Thomas | |
| 8,666,006 B1* | 3/2014 | Fu et al. | 375/355 |
| 2008/0137790 A1 | 6/2008 | Cranford et al. | |
| 2008/0252345 A1* | 10/2008 | Deschamp et al. | 327/161 |
| 2013/0243127 A1* | 9/2013 | Chmelar et al. | 375/316 |

OTHER PUBLICATIONS

U.S. Appl. No. 14/683,897, Office Action Dated May 5, 2015, 12 pgs.

* cited by examiner

*Primary Examiner* — Kabir A Timory
(74) *Attorney, Agent, or Firm* — Dennis R. Haszko

(57) ABSTRACT

A method and system are disclosed which determine a frequency offset between a reference clock frequency of a receiver and a transmit clock frequency embedded in a received non-return to zero (NRZ) signal. A polarity of the frequency offset is determined based on a moving direction of a sampling clock edge relative to an edge of a signal eye of the received NRZ signal and a region of the signal eye containing the sampling clock edge. A magnitude of the frequency offset is determined based on a time taken by the sampling clock edge to sweep the signal eye.

16 Claims, 10 Drawing Sheets

Data sample is sampled at eye edge

Data sample is sampled at eye center

WIDE-RANGE FAST-LOCK FREQUENCY ACQUISITION FOR CLOCK AND DATA RECOVERY

FIELD

The present disclosure relates generally to digital telecommunications. More particularly, the present disclosure relates to frequency acquisition for clock and data recovery in high-speed data communication systems.

BACKGROUND

Separate reference clock and data-clocked receiver architectures are widely used in high-speed data communication systems. Without a common reference clock between a far-end (FE) transmitter and a near-end (NE) receiver, the clock frequency of an incoming non-return-to-zero (NRZ) signal—or equivalently, the FE transmit clock frequency—is unknown at the NE receiver. A receiver must lock to the clock frequency embedded in the incoming NRZ signal in order to recover information bits.

In synchronous clock and data recovery (CDR), an NE sampling clock is adjusted so that both its phase and frequency lock to the incoming NRZ signal. In asynchronous CDR, the incoming signal is oversampled using an asynchronous NE clock whose frequency is generally a multiple of the frequency of the FE transmit clock. Information bits are extracted from the oversampled signal based on the estimated clock frequency and phase embedded in the incoming signal. In either case, a receiver must detect the frequency offset (FO) between the local sampling clock and the clock frequency of the incoming signal, and adjust the NE receiver accordingly to lock to the clock frequency of the incoming signal. This process is called frequency acquisition.

In conventional clock recovery based on the filtering of phase error, both frequency acquisition and jitter tracking are handled by the same clock recovery circuit which is often optimized for jitter tolerance. In contrast to clock jitter tracking which starts from an initial frequency lock, frequency acquisition usually starts from a large FO. Thus, both the lock range and the speed of frequency acquisition are limited.

One of the challenges of frequency acquisition using a conventional clock recovery loop is that the FO lock range is limited by the pull-in range of the clock recovery loop. Electrical idle and invalid incoming signals can often drive the frequency of a recovered local clock out of the pull-in range. Once the FO between the recovered clock and the clock frequency of the incoming NRZ signal exceeds the pull-in range, a recovered clock could either lock to a false frequency or run away instead of locking to the incoming NRZ signal.

One approach used to address an out-of-range initial FO is to delay frequency acquisition until valid incoming signals are received; however, this technique complicates system design and integration, particularly in applications where the starting time of valid signals is not deterministic.

Another approach used to address an out-of-range initial FO is to clamp the frequency of the recovered clock to pre-determined values. This approach can effectively prevent the frequency of a recovered clock from running away; however, it requires dynamic adjustment of frequency tracking ranges based on information of rates, modes, spread-spectrum clocking (SSC), and jitter, etc. If the information is not available on the fly, then the selection of a frequency clamping range and the ability to support multiple industry standards becomes impractical. A recovered clock can fail to lock to the incoming NRZ signal if the clamped frequency range is too large or too small.

A number of further solutions for frequency acquisition in timing recovery have been proposed, but which do not satisfactorily overcome the above issues.

For example, U.S. Pat. No. 8,284,888 to Kyles, the entirely of which is incorporated herein by reference, discloses frequency acquisition using two clock recovery loops. A first loop supplies a first clock signal to a second loop based on frequency comparison and data transition density metrics. The second loop modifies the first clock signal to produce the recovered clock signal and uses the recovered clock signal to produce the recovered data signal. The overall clock recovery can operate independently over a wide frequency range. This method is limited, however, in that the transition density of an incoming NRZ signal needs to be known at a receiver.

U.S. Pat. No. 6,331,792 to Toniett, the entirety of which is incorporated herein by reference, discloses FO detection for frequency acquisition. Toniett describes using a frequency detector: to detect the edges of incoming data, to count the rising edges of the local clock (variable controlled oscillator, VCO), and to generate a pulse when no rising edge of the local clock is detected between two edges of the data. The pulses corresponding to the frequency offset between the incoming NRZ signal and the local clock are then used in a feedback loop to control the local clock.

U.S. Pat. No. 7,558,342 to Meltzer, the entirety of which is incorporated herein by reference, discloses a circuit and method for recovering a periodic signal from a data signal. A reference signal is produced from a data signal and is compared to a recovered clock signal to generate a correction pulse. An oscillator frequency is adjusted in response to the correction pulse and the recovered clock signal.

U.S. Pat. No. 7,936,853 to Pang et al., the entirety of which is incorporated herein by reference, discloses a system and method for the detection of false clock frequency lock. The method comprises the steps of creating a clock signal from the edge transitions of a raw data signal (incoming signal), sampling the raw data signal at the rate of the clock signal and counting edge transitions, then comparing the raw count to the sample count to determine if they are equivalent. This technique can be used in applications with slow-changing FO. In applications where transmit clock is modulated with SSC, the clock signal created from edge transitions can lag behind the clock frequency of incoming data signal and lead to inaccurate frequency offset detection.

U.S. Pat. No. 6,856,206 to Perrott, the entirety of which is incorporated herein by reference, discloses frequency acquisition by detecting transitions in the input data stream that fall within a particular zone of a sample clock sampling the input data stream. The number of transitions in the zone is counted to determine if a lock exists. If the lock is not achieved, then an output of a variable oscillator circuit used in the clock recovery operation is adjusted until the number of transitions in any particular zone is below a certain level. Using this technique, the acceptable probability of transitions in a selected zone for a given bit error rate must be determined.

While the foregoing address some of the issues associated with frequency acquisition in timing recovery, improvements remain possible and desirable.

BRIEF DESCRIPTION OF THE DRAWINGS

Embodiments of the present invention will now be described, by way of example only, with reference to the attached drawings, as follows.

DESCRIPTION

Figure 1:
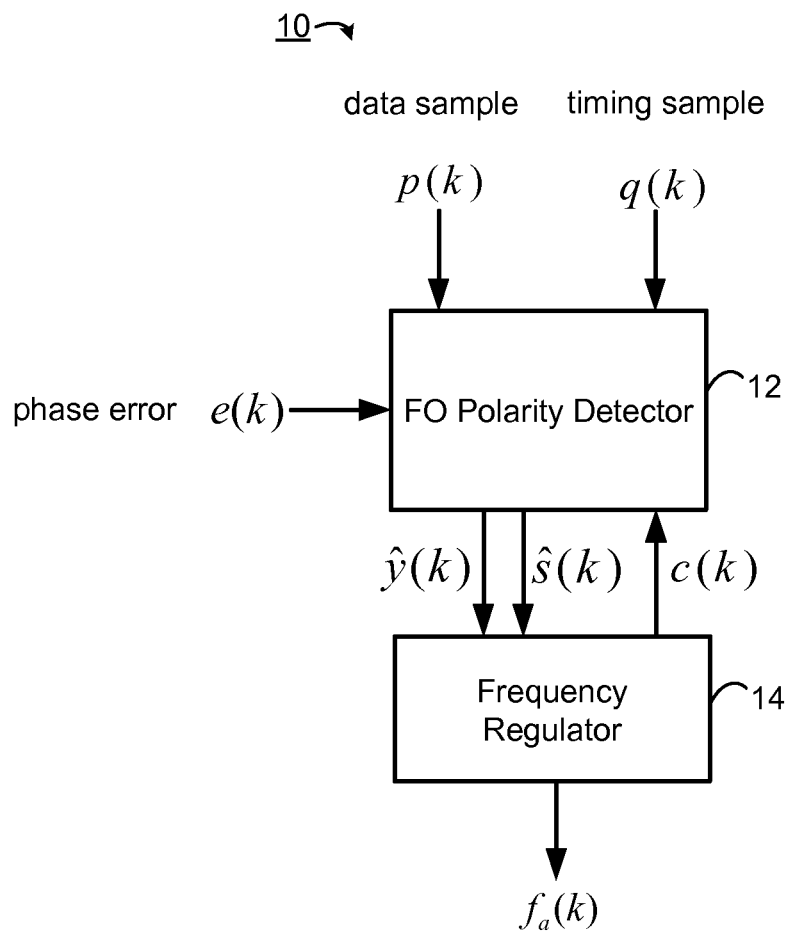
FIG. 1 is a schematic diagram of an apparatus employing wide-range fast-lock frequency (WFFA) acquisition.

The technique disclosed herein generally employs wide-range fast-lock frequency acquisition (WFFA) as an integral part of CDR. While prior approaches estimated FO either by filtering phase error or by comparing a recovered clock with the transitions of an incoming NRZ signal, WFFA detects FO polarity and FO magnitude separately. FO polarity is determined by detecting the moving direction of the sampling clock edge relative to the eye edge of incoming NRZ signals. FO magnitude is determined based on the time required for the sampling clock edge to sweep through a signal eye, that is to transition from an eye edge to an eye center and then to the opposite eye edge.

The disclosed technique has the advantage that frequency acquisition and jitter tracking are decoupled and controlled separately by WFFA and a clock recovery loop, respectively. WFFA becomes active upon the detection of the sampling clock edge sweeping through the eye of an incoming NRZ signal. WFFA enters into standby mode automatically after frequency acquisition, and fine frequency and phase tracking is controlled by a clock recovery loop.

The decoupling of frequency acquisition from jitter tracking enables wide-range fast-lock frequency acquisition while maintaining a clock recovery loop optimized for jitter tolerance. The frequency acquisition range is not limited by the pull-in range of a clock recovery loop. WFFA tracks the frequency lock status. When equalization is unavailable before frequency lock and the initial FO is outside the lock range of the clock recovery loop, the recovered clock frequency can either lock to a false frequency or drift away from the clock frequency of the incoming signals. WFFA can detect false frequency lock and prevent frequency runaway in the presence of a large initial FO.

Thus, a first method of determining a frequency offset between a reference clock frequency of a receiver and a transmit clock frequency embedded in a received non-return to zero (NRZ) signal has the following steps. A polarity of the frequency offset is determined based on a moving direction of a sampling clock edge relative to an edge of a signal eye of the received NRZ signal and a region of the signal eye containing the sampling clock edge. A magnitude of the frequency offset is determined based on a time taken by the sampling clock edge to sweep the signal eye.

The polarity of the frequency offset may be determined based on a correlation between indications of the moving direction of the sampling clock edge and corresponding indications of the signal eye region containing the sampling clock edge. The signal eye region indications may be generated based on phase errors of the received digital signal. The phase errors may be generated by a Gardner phase detector.

The moving direction indications may be generated based on center-sampling indications indicating that data samples are sampled at a center of the signal eye, and edge-sampling indications indicating that data samples are sampled at an edge of the signal eye, wherein the center-sampling indications and the edge-sampling indications are generated from samples of the received digital signal. The samples of the received digital signal may comprise data samples p(k) and timing samples q(k), each timing sample q(k) leading a respective data sample p(k) by one-half of a unit interval of the data samples p(k), wherein k is a discrete time index. The center-sampling indications may be generated when corresponding data samples p(k) and timing samples q(k) samples are related by:

$$\{sign[p(k-1)] \neq sign[p(k)]\}$$

$$\cap [|q(k)| < u|p(k)|]$$

$$\cap [|q(k)| < u|p(k-1)|]$$

and wherein edge-sampling indications are generated when corresponding data samples p(k) and timing samples q(k) samples are related by:

$$\{sign[q(k-1)] \neq sign[q(k)]\}$$

$$\cap [|p(k)| < u|q(k-1)|]$$

$$\Omega[|p(k)| < u|q(k)|],$$

wherein u is a scaling factor wherein $0 < u \leq 1$.

The moving direction of the sampling clock edge relative to the edge of the signal eye may be either away from the signal eye edge or toward the signal eye edge.

The region of the signal eye containing the sampling clock edge may be determined relative to a center of the signal eye, wherein the region comprises either a left-half of the signal eye or a right-half of the signal eye.

The method may further comprise determining the time taken by the sampling clock edge to sweep the signal eye, wherein edge-crossing events of the sampling clock edge crossing the edge or an opposite edge of the signal eye are detected, and further wherein center-crossing events of the sampling clock edge crossing a center of the signal eye are detected. Determining the time taken by the sampling clock edge to sweep the signal eye may comprise detecting a first edge-crossing event within a first time-out period, and then detecting a center-crossing event within a second time-out period, and then detecting a second edge-crossing event within a third time-out period, and determining a number of clock cycles between the first edge-crossing event and the second edge-crossing event.

A device for determining a frequency offset between a reference clock frequency of a receiver and a transmit clock frequency embedded in a received digital signal may comprise a frequency offset polarity detector and a frequency offset regulator. The frequency offset polarity detector is configured to determine a polarity of the frequency offset based on a moving direction of a sampling clock edge relative to an edge of a signal eye of the received digital signal and a region of the signal eye containing the sampling clock edge. The frequency offset regulator is configured to determine a magnitude of the frequency offset based on a time taken by the sampling clock edge to sweep the signal eye.

The frequency offset polarity detector may comprise a polarity decision circuit configured to determine the polarity of the frequency offset based on a correlation between indications of the moving direction of the sampling clock edge and corresponding indications of the signal eye region containing the sampling clock edge. The polarity decision circuit may be configured to generate the signal eye region indications based on phase errors of the received digital signal. The phase errors may be received from a Gardner phase detector.

The frequency offset polarity detector may further comprise an edge-center sampling detector configured to generate center-sampling indications and edge-sampling indications from samples of the received digital signal, wherein the polarity decision circuit is further configured to generate the moving direction indications based on the center-sampling indications and edge-sampling indications received from the edge-center sampling detector.

The samples of the received digital signal may comprise data samples p(k) and timing samples q(k), each timing sample q(k) leading a respective data sample p(k) by one-half of a unit interval of the data samples p(k), wherein k is a discrete time index.

The center-sampling indications may be generated when corresponding data samples p(k) and timing samples q(k) are related by:

$$\{\text{sign}[p(k-1)] \neq \text{sign}[p(k)]\}$$

$$\cap [|q(k)| < u|p(k)|]$$

$$\cap [|q(k)| < u|p(k-1)|]$$

and wherein edge-sampling indications are generated when corresponding data samples p(k) and timing samples q(k) samples are related by:

$$\{\text{sign}[q(k-1)] \neq \text{sign}[q(k)]\}$$

$$\cap [|p(k)| < u|q(k-1)|]$$

$$\Omega[|p(k)| < u|q(k)|],$$

wherein u is a scaling factor wherein $0 < u \leq 1$.

The moving direction of the sampling clock edge relative to the edge of the signal eye may be either away from the signal eye edge or toward the signal eye edge.

The region of the signal eye containing the sampling clock edge may be determined relative to a center of the signal eye, wherein the region comprises either a left-half of the signal eye or a right-half of the signal eye.

The frequency offset regulator may be configured to detect edge-crossing events of the sampling clock edge crossing the edge or an opposite edge of the signal eye and further to detect center-crossing events of the sampling clock edge crossing a center of the signal eye are detected, and further to determine the time taken by the sampling clock edge to sweep the signal eye based on the edge-crossing events and center-crossing events.

The frequency offset regulator may comprise a frequency regulator finite state machine (FSM) configured to determine the time taken by the sampling clock edge to sweep the signal eye, wherein the frequency regulator FSM detects a first edge-crossing event within a first time-out period, and then detects a center-crossing event within a second time-out period, and then detects a second edge-crossing event within a third time-out period, and determines a number of clock cycles between the first edge-crossing event and the second edge-crossing event.

The frequency offset regulator may be further configured to generate a frequency correction signal based on the polarity and magnitude of the frequency offset.

A clock and data recovery system may comprise at least one analog-to-digital converter (ADC), a data recovery subsystem, a phase error detector, the device for determining a frequency offset as described above, and a loop filter. The at least one ADC receives and samples the received digital signal based on the reference clock frequency to generate data samples and timing samples. The data recovery subsystem receives the samples from the ADC and detects and outputs information bits. The phase error detector receives the samples from the ADC and detects phase errors between the sampling clock edge relative to a center of the signal eye. The device for determining a frequency offset receives the samples from the ADC and the phase errors from the phase error detector, and generates the frequency correction signal. The loop filter receives the frequency correction signal and regulates the reference clock frequency based on the frequency correction signal.

Exemplary embodiments are now described with reference to the drawings.

FIG. 1 shows a block diagram of an apparatus 10 employing WFFA. For the purposes only of facilitating description, the present embodiment assumes a CDR with 2× sampling of an incoming NRZ signal, but the extension to CDR with higher sampling rates will be obvious to those versed in the art, and thus the present assumption is not intended to be limiting in any way.

The apparatus has a FO polarity detector 12 and a frequency regulator 14. The FO polarity detector 12 determines whether the frequency of the recovered clock is larger or smaller than the clock frequency of the incoming NRZ signal. The frequency regulator 14 computes FO magnitude and adjusts the local clock frequency an amount corresponding to the magnitude of the FO, in the opposite direction of the FO polarity. Let k denote the index of discrete time. The input signals of the apparatus 10 include data sample p(k) for data recovery, timing sample q(k) which leads p(k) by one half of unit interval (UI) of sample p(k), and phase error e(k) detected by a phase error detector. For a synchronous CDR, the output control signal $f_a(k)$ is the amount of frequency adjustment of the recovered clock. For an asynchronous CDR, the output control signal $f_a(k)$ is used to adjust the timing for data extraction or interpolation.

FO polarity detector 12 detects FO polarity by correlating the moving direction (or, direction of motion) of the local sampling clock edge relative to an eye edge with the location of the sampling clock edge relative to an eye center, i.e. left half of an eye or right half of an eye. In one embodiment, the FO polarity detector 12 derives this correlation as follows.

Let s(t) denote the FO polarity at continuous time t:

$$s(t) = \text{sign}(f_o) = \text{sign}(f_s - f_d) \quad (1)$$

wherein $f_s$ is the frequency of the recovered sampling clock and $f_d$ is the clock frequency of the incoming NRZ signal (or equivalently, the FE transmit clock frequency).

Let y(t) denote the normalized sampling time offset relative to an eye edge such that y(t)=1 and y(t)=−1 represent center sampling and edge sampling, respectively.

Without loss of generality, assume ê(t) and ŷ(t)—normally, filtered signals of phase error, e(t), and y(t)—are estimates of e(t) and y(t), respectively, in one unit interval (UI) centering at an eye center. FO polarity can be detected based on the correlation between ê(t) and the derivative of ŷ(t). Signals ê(t) and ŷ(t) in one UI are given by:

$$\hat{e}(t) = -2\pi f_o t \text{ for } \left(-\frac{1}{2|f_o|} \leq t \leq \frac{1}{2|f_o|}\right) \quad (2)$$

and $$\hat{y}(t) = \begin{cases} 1 + 4f_o|t| & \text{if } (f_o < 0) \cap \left(-\frac{1}{2|f_o|} \leq t \leq \frac{1}{2|f_o|}\right) \\ 1 - 4f_o|t| & \text{if } (f_o > 0) \cap \left(-\frac{1}{2|f_o|} \leq t \leq \frac{1}{2|f_o|}\right) \end{cases} \quad (3)$$

respectively.

Let d(t) represent the moving direction of the sampling clock edge near an eye edge, i.e.:

$$d(t) = \begin{cases} 1 & \text{outbound: moves away from an eye edge} \\ -1 & \text{inbound: moves towards an eye edge} \end{cases} \quad (4)$$

It can be derived that $$d(t) = \text{sign}\left(\frac{d\hat{y}}{dt}\right) = \quad (5)$$

$$\begin{cases} \text{sign}\left(\frac{4f_o|t|}{t}\right) & \text{if } (f_o < 0) \cap \left(-\frac{1}{2|f_o|} < t < \frac{1}{2|f_o|}\right) \cap (t \neq 0) \\ \text{sign}\left(-\frac{4f_o|t|}{t}\right) & \text{if } (f_o > 0) \cap \left(-\frac{1}{2|f_o|} < t < \frac{1}{2|f_o|}\right) \cap (t \neq 0) \end{cases}$$

By combining Equations (2) and (5), it follows that $$d(t) \text{ sign } [\hat{e}(t)] = \begin{cases} -1 & \text{if } (f_o < 0) \cap \left(-\frac{1}{2|f_o|} < t < \frac{1}{2|f_o|}\right) \cap (t \neq 0) \\ 1 & \text{if } (f_o > 0) \cap \left(-\frac{1}{2|f_o|} < t < \frac{1}{2|f_o|}\right) \cap (t \neq 0) \end{cases} \quad (6)$$

It can be derived from Equation (6) that FO polarity s(t) equals the sign product of the phase error and the moving direction of sampling clock edge, i.e.:

$$s(t) = d(t) \text{ sign } [\hat{e}(t)] = d(g)h(t) \text{ for } \left(-\frac{1}{2|f_o|} < t < \frac{1}{2|f_o|}\right) \cap (t \neq 0) \quad (7)$$

Equation (7) can be rewritten as:

$$s(t) = d(t)h(t) \text{ for } \left(-\frac{1}{2|f_o|} < t < \frac{1}{2|f_o|}\right) \cap (t \neq 0) \quad (8)$$

where eye region indicator h(t)=sign[ê(t)] represents the sampling location relative to an eye center such that:

$$h(t) = \begin{cases} -1 & \text{left-half (LH) eye} \\ 1 & \text{right-half (RH) eye} \end{cases} \quad (9)$$

The instantaneous FO polarity obtained from equation (8) can be noisy, particularly for applications with a closed eye. Let ŝ(t) denote an estimate of s(t), wherein in one embodiment a low-pass filter, such as an integrator, is used to compute the correlation between the moving direction of the sampling clock edge relative to an eye edge and its location relative to an eye center. A more accurate estimate of FO polarity is then given by $$\hat{s}(t) = \text{sign}[\int_0^{T_d} d(t)h(t)dt] \quad (10)$$

where $T_d$ is the adjustment interval of the recovered clock. Where k denotes the discrete time index, a discrete-time representation of FO polarity is given by $$\hat{s}(k) = \text{sign}\left[\sum_{k=0}^{N_d-1} d(k)h(k)\right] \quad (11)$$

where $N_d$ is the number of clock cycles in interval $T_d$.

To follow the convention of annotation in digital design, discrete signals are used hereafter by replacing continuous time t with discrete time index k. A conceptual representation of Equation (11) is shown in FIG. 2.

Figure 2:
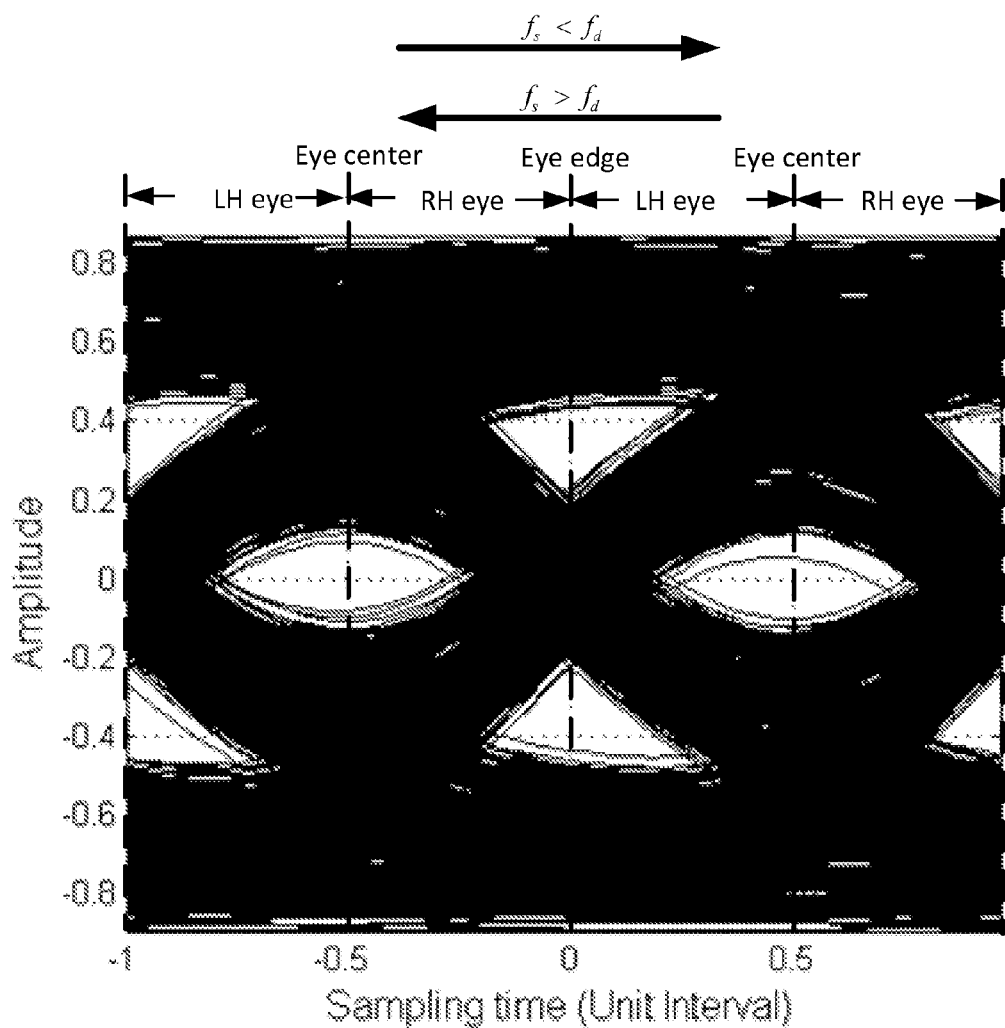
FIG. 2 is an eye diagram of an NRZ signal in two unit intervals.

FIG. 2 shows an eye diagram of an NRZ signal in two unit intervals (UI's). Each eye is divided into a left-half (LH) eye and a right-half (RH) eye centering at a respective eye center. In case of a positive FO, i.e., $f_s > f_d$, the sampling clock edge moves away from an eye edge in the RH eye and moves towards an eye edge in the LH eye. The moving direction indicator d(k)=1 and d(k)=−1, is thus positively correlated with eye region indicator h(k)=1 and h(k)=−1, respectively. In case of negative FO, i.e., $f_s < f_d$, the sampling clock edge moves away from an eye edge in the LH eye and moves towards an eye edge in the RH eye. The moving direction indicator d(k)=1 and d(k)=−1, is thus negatively correlated with eye region indicator h(k)=−1 and h(k)=1, respectively.

Figure 3:
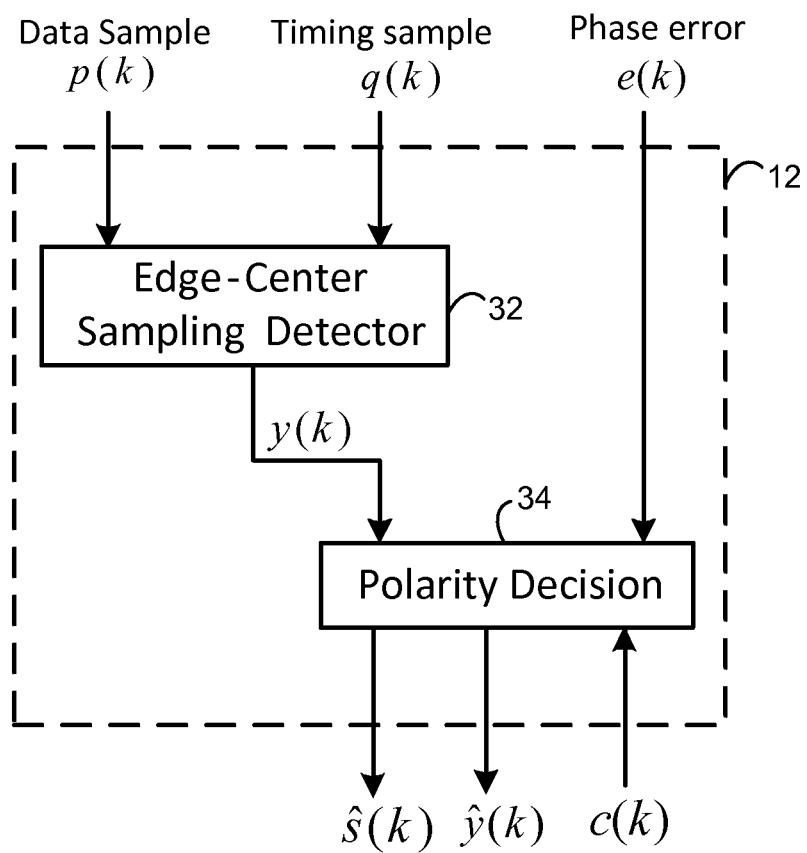
FIG. 3 is a schematic diagram of one embodiment of a FO polarity detector.

FIG. 3 shows an embodiment of a FO polarity detector 12 for a CDR, which in one embodiment is a CDR with 2× sampling. Let k denote a discrete time index. The inputs to the polarity detector include data sample p(k) for data recovery, timing sample q(k) which leads data sample p(k) by half UI, and phase error e(k) from the output of a phase error detector (which in one embodiment is a Gardner phase detector). The edge-center sampling detector 32 detects edge sampling and center sampling of data signal p(k). Signal y(k) of the edge-center sampling detector 32 output is the indicator of center-sampling and edge sampling. It is used by polarity decision circuit 34 to determine FO polarity. A first output signal ŝ(k) of polarity decision circuit represents the estimated FO polarity. The second output signal ŷ(k), a filtered version of y(k), is used by frequency regulator 14 to detect edge-crossing and center-crossing of signal eye.

Figure 4A:
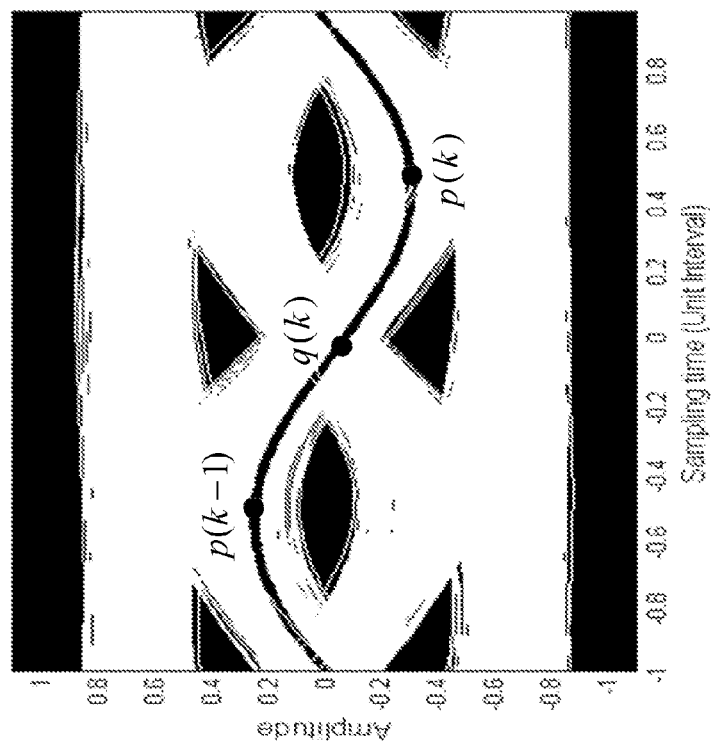
FIG. 4A and FIG. 4B are eye diagrams illustrating edge sampling and center sampling, respectively.
Figure 4B:
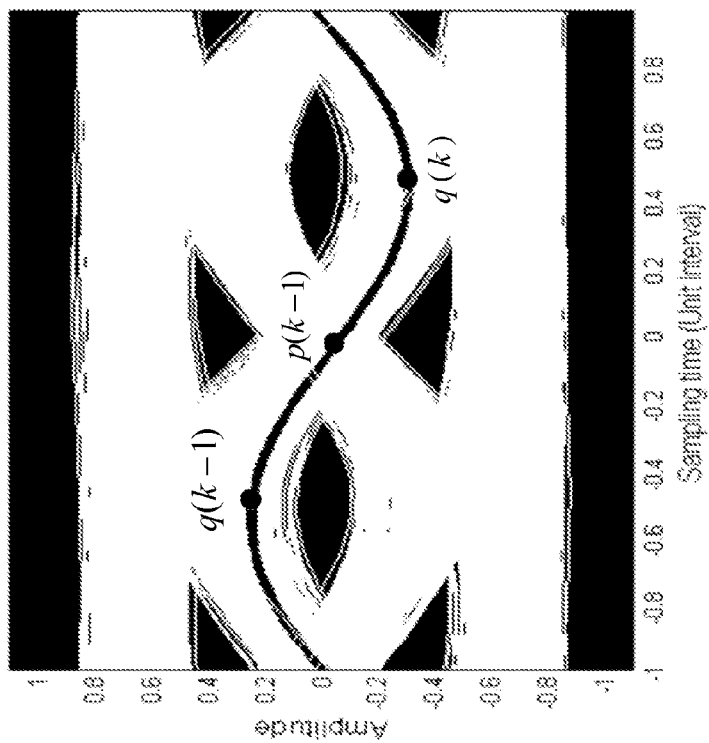

Edge-center sampling detector 32 detects edge sampling and center sampling of the data signal. It provides an output signal y(k) which is used for FO polarity detection and FO magnitude estimation. Edge sampling and center sampling are illustrated in FIG. 4A and FIG. 4B, respectively. As shown in FIG. 4A, in the case of edge sampling, a data sample $d_k$ is sampled at an eye edge and, accordingly, adjacent timing samples q(k−1) and q(k) are sampled at corresponding eye centers. If there is a transition between q(k−1) and q(k), the magnitude of data sample p(k−1) is less than the magnitudes of both timing samples q(k−1) and q(k). As shown in FIG. 4B, in the case of center sampling, data samples p(k−1) and p(k) are sampled near corresponding eye centers and their respective magnitudes are larger than the in-between timing sample q(k). This difference in signal magnitudes between data samples and timing samples are used to detect edge sampling and center sampling.

Figure 5:
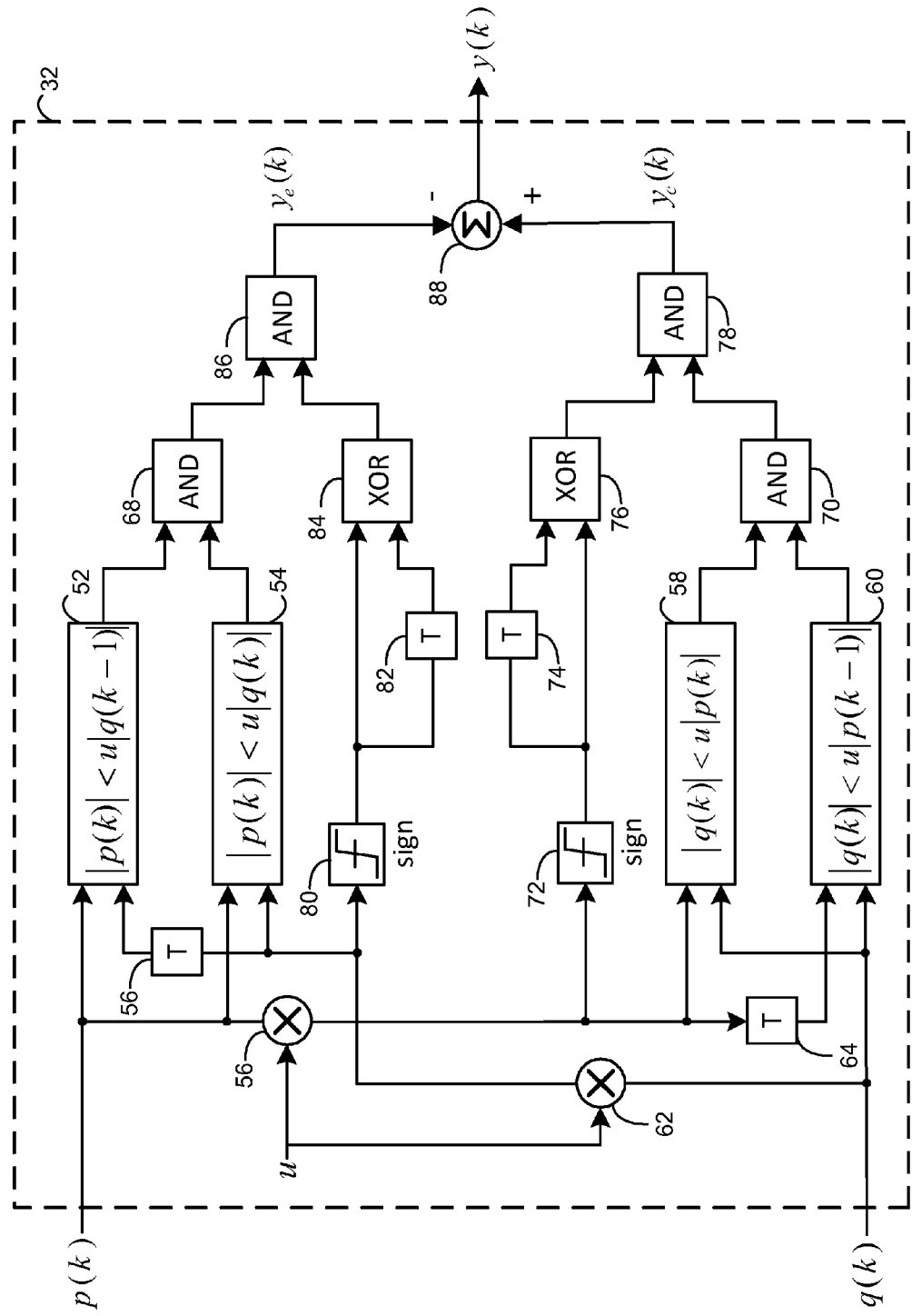
FIG. 5 is a schematic diagram of one embodiment of an edge-center sampling detector.

One embodiment of edge-center sampling detector 32 is shown in FIG. 5. The edge-center sampling detector is configured to process a single data sample and a single timing sample at a time, though modification to parallel block processing will be obvious to those versed in the art, hence this embodiment is not intended to be limiting in any way.

Edge-sampling is detected by comparing the magnitudes of two timing samples with their in-between data sample. An edge-sampling indicator is given by:

$$y_e(k)=\{\text{sign}[q(k-1)]\neq\text{sign}[q(k)]\}$$
$$\cap[|p(k)|<u|q(k)|]$$
$$\cap[|p(k)|<u|q(k-1)|] \quad (12)$$

where u is a scaling factor which normally equals to 1. Other values, i.e., 0<u<1, can be chosen depending on analog-digital mapping of edge and data samples. Thus, 0<u≤1.

As shown in FIG. 5, the transition between two consecutive timing samples is detected by comparing their signal polarities. The magnitudes of the two timing samples are compared to the signal magnitude of in-between data sample p(k) in parallel. If q(k) and q(k−1), which equals to q(k) delayed by one UI, have opposite polarities, and the magnitude of data sample p(k) is less than the two adjacent timing samples q(k) and q(k−1), then edge-sampling indicator $y_e(k)=1$, otherwise, $y_e(k)=0$.

Center-sampling is detected by comparing the magnitudes of two consecutive data samples with their in-between timing sample. A center-sampling indicator is given by:

$$y_c(k)=\{\text{sign}[p(k-1)]\neq\text{sign}[p(k)]\}$$
$$\cap[|q(k)|<u|p(k)|]$$
$$\cap[|q(k)|<u|p(k-1)|] \quad (13)$$

As shown in FIG. 5, the transition between two consecutive data samples is detected by comparing their signal polarities. The magnitudes of the two data samples are compared to the signal magnitude of in-between timing sample q(k). If p(k) and p(k−1), which equals to p(k) delayed by one UI, have opposite polarity, and the magnitude of timing sample q(k) is less than the two adjacent data samples p(k) and p(k−1), then center-sampling indicator $y_c(k)=1$, otherwise, $y_c(k)=0$.

A combined edge-center sampling indicator is given by:

$$y(k)=y_c(k)-y_e(k) \quad (14)$$

If y(k)=−1, it indicates that the current data sample is near an eye edge, and if y(k)=1, it indicates that the current data sample is near an eye center, otherwise, the current data sample is neither near an eye edge nor near an eye center.

Thus, in one embodiment, data sample p(k) is received by block 52 and block 54, which function as described shortly. Data sample p(k) is also received by multiplier 56 which also receives u and generates u p(k). Timing sample q(k) is received by block 58 and block 60, which function as described shortly. Timing sample q(k) is also received by multiplier 62 which also receives u and generates u q(k). Output u p(k) of multiplier 56 is received by block 58 and delayed by one UI by delay circuit, 64, e.g. a D flip-flop, which generates u p(k−1), which is received by block 60. Similarly, output u q(k) of multiplier 62 is received by block 54 and delayed one UI by delay circuit 66 which delays input signal by one UI and generates u q(k−1), which is received by block 52.

Based on inputs p(k) and u q(k−1), block 52 generates |p(k)|<u|q(k−1)|, which is received by AND block 68. Similarly, based on inputs p(k) and u q(k), block 54 generates |p(k)|<u|q(k)|, which is also received by AND block 68. Thus, AND block 68 outputs the result of [|p(k)|<u|q(k−1)|]∩[|p(k)|<u|q(k)|].

Likewise, based on inputs q(k) and u p(k), block 58 generates |q(k)|<u|p(k)|, which is received by AND block 70. Similarly, based on inputs q(k) and u p(k−1), block 60 generates |q(k)|<u|p(k−1)|, which is also received by AND block 70. Thus, AND block 70 outputs the result of [|q(k)|<u|p(k)|]∩[|q(k)|<u|p(k−1)|].

Output u p(k) of multiplier 56 is also received by sign operation 72 which outputs sign[p(k)], which is received by delay circuit 74 which generates sign[p(k−1)], both of which are received by XOR block 76 which outputs the result of sign[p(k−1)]≠sign[p(k)]. The output of XOR block 76 is received by AND block 78 which also receives the output of AND block 70. Consequently, AND block 78 outputs $y_c(k)$ according to Equation (13), above.

Similarly, output u q(k) of multiplier 62 is also received by sign operation 80 which outputs sign[q(k)], which is received by delay circuit 82 which generates sign[q(k−1)], both of which are received by XOR block 84 which outputs the result of sign[q(k−1)]≠sign[q(k)]. The output of XOR block 84 is received by AND block 86 which also receives the output of AND block 68. Consequently, AND block 86 outputs $y_e(k)$ according to Equation (12), above.

Finally, subtraction operation 88 receives $y_c(k)$ from AND block 78 and $y_e(k)$ from AND block 86, and generates combined edge-center sampling indicator $y(k)=y_c(k)-y_e(k)$ Returning to FIG. 3, polarity decision circuit 34 determines FO polarity ŝ(k) by correlating an eye region indicator with the moving direction of the sampling clock edge relative to an eye edge. One embodiment of polarity decision circuit 34 is shown in FIG. 6.

Figure 6:
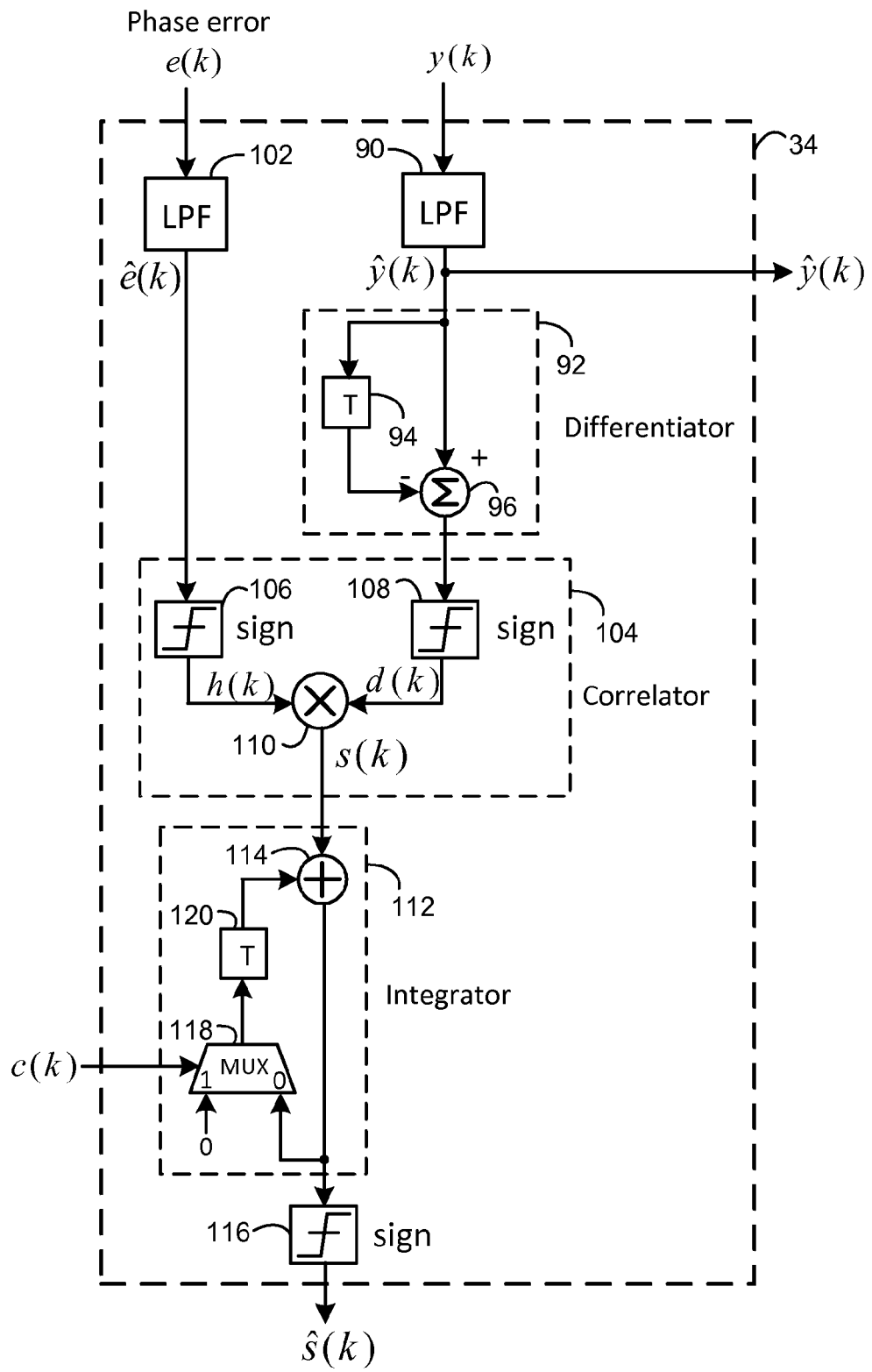
FIG. 6 is a schematic diagram of one embodiment of a polarity decision circuit.

With reference to FIG. 6, a low-pass filter (LPF) 90, such as a moving average filter, is applied to the output signal of edge-center sampling detector y(k) for the filtering of high-frequency noise, particularly, for applications with a closed eye. The output ŷ(k) of the LPF is an estimate of the sampling time offset relative to an eye edge. A differentiator 92 cascaded with a slicer 108 for sign operation is then applied to signal ŷ(k) at LPF output to estimate the moving direction d(k) of sampling clock edge relative to an eye edge. In one embodiment, differentiator 92 includes a delay circuit 94 which receives ŷ(k) and generates ŷ(k−1), and a subtraction block 96 which receives ŷ(k) as well as ŷ(k−1) from the delay circuit 94, and generates ŷ(k)−ŷ(k−1).

In parallel with the detection of moving direction, another LPF 102, which may be identical to LPF 90, is applied to phase error e(k) to filter out high-frequency noise and keep the delay alignment between ŷ(k) and ê(k). Correlator 104 has sign operation 106 which receives the filtered phase error ê(k) and generates eye region indicator h(k). Similarly, correlator 104 also has sign operation 108 which receives ŷ(k)−ŷ(k−1) from differentiator 92 and outputs moving direction indicator d(k), which is then multiplied by multiplier 110 with eye region indicator h(k) to generate a pre-estimate of instantaneous FO polarity s(k).

The pre-estimate of FO polarity s(k) is fed into an integrator 112 to compute the correlation between the moving direction of the sampling clock edge relative to an eye edge and the sampling clock edge's eye region relative to an eye center. In one embodiment, the integrator 112 has an addition operation 114 which outputs sign operation 116 which outputs ŝ(k) being the detected FO polarity. The integrator 112 also has a multiplexer 118 which receives the output of addition operation 114 and 0, the latter being selected which signal c(k) from frequency regulator 14 (see FIG. 1) is asserted to clear the integrator output in the FO polarity detector before returning to initialization state. Output of multiplexer 118 is received by a delay buffer 120 which outputs to addition operation 114.

With reference to FIG. 1, frequency regulator 14 estimates FO magnitude based on the time it takes for the sampling clock edge to sweep through an eye. Based on the estimated FO magnitude, the frequency regulator 14 adjusts the frequency of a recovered clock to lock to the clock frequency of an incoming NRZ signal during frequency acquisition. One embodiment of frequency regulator 14 is shown in FIG. 7.

Figure 7:
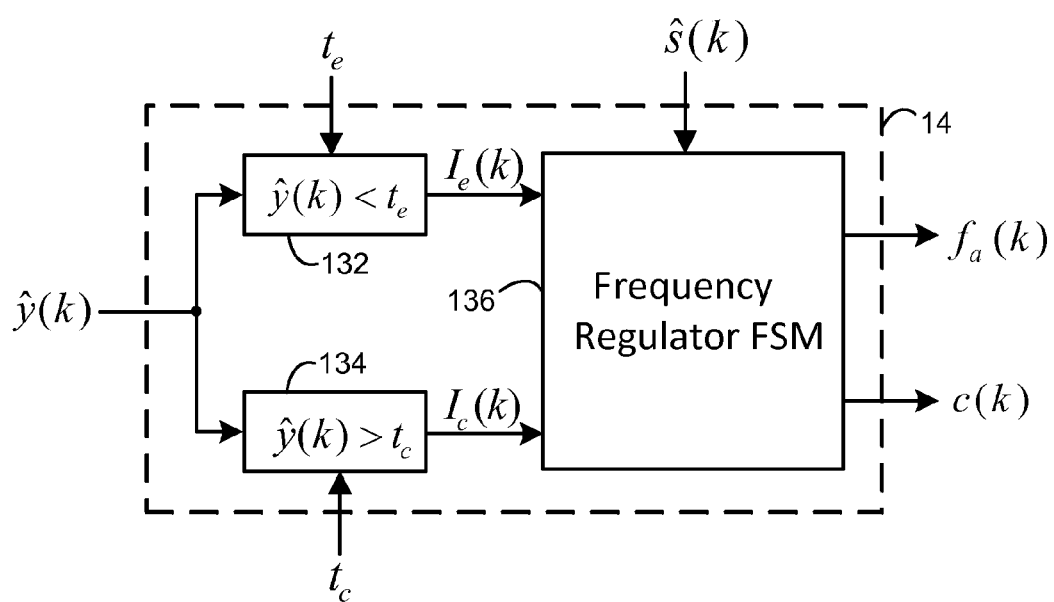
FIG. 7 is a schematic diagram of one embodiment of a frequency regulator.

With reference to FIG. 7, the amplitude of sampling time offset ŷ(k) received from the FO polarity detector 12 is compared by blocks 132 and 134 with thresholds $t_e$ and $t_c$ to detect edge-crossing event $I_e(k)$ and center-crossing event $I_c(k)$, respectively. If ŷ(k)<$t_e$, an edge-crossing event is asserted, i.e., $I_e(k)$=1. If ŷ(k)>$t_c$, a center-crossing event is asserted, i.e., $I_c(k)$=1.

The events of edge crossing and center crossing together are used to activate the frequency acquisition circuit and estimate the time it takes for a sampling clock edge sweeping through an eye. The control logic of a frequency regulator can be implemented as a finite state machine (FSM) 136. In a synchronous CDR, the output control signal $f_a(k)$ of the frequency regulator FSM 136 is used to regulate the frequency of the recovered sampling clock to lock to the clock frequency of incoming NRZ signal. In an asynchronous CDR, it is used to adjust the timing for extracting or interpolating information bits from oversampled signal samples. Depending on the specific implementation of a CDR, $f_a(k)$ can be used to adjust the estimated frequency offset in a loop filter of clock recovery loop, or fed into a voltage-controlled oscillator (VCO) for direct frequency adjustment. Output signal c(k) is a reset signal used to reset FO polarity detector upon the completion of frequency adjustment.

Figure 8:
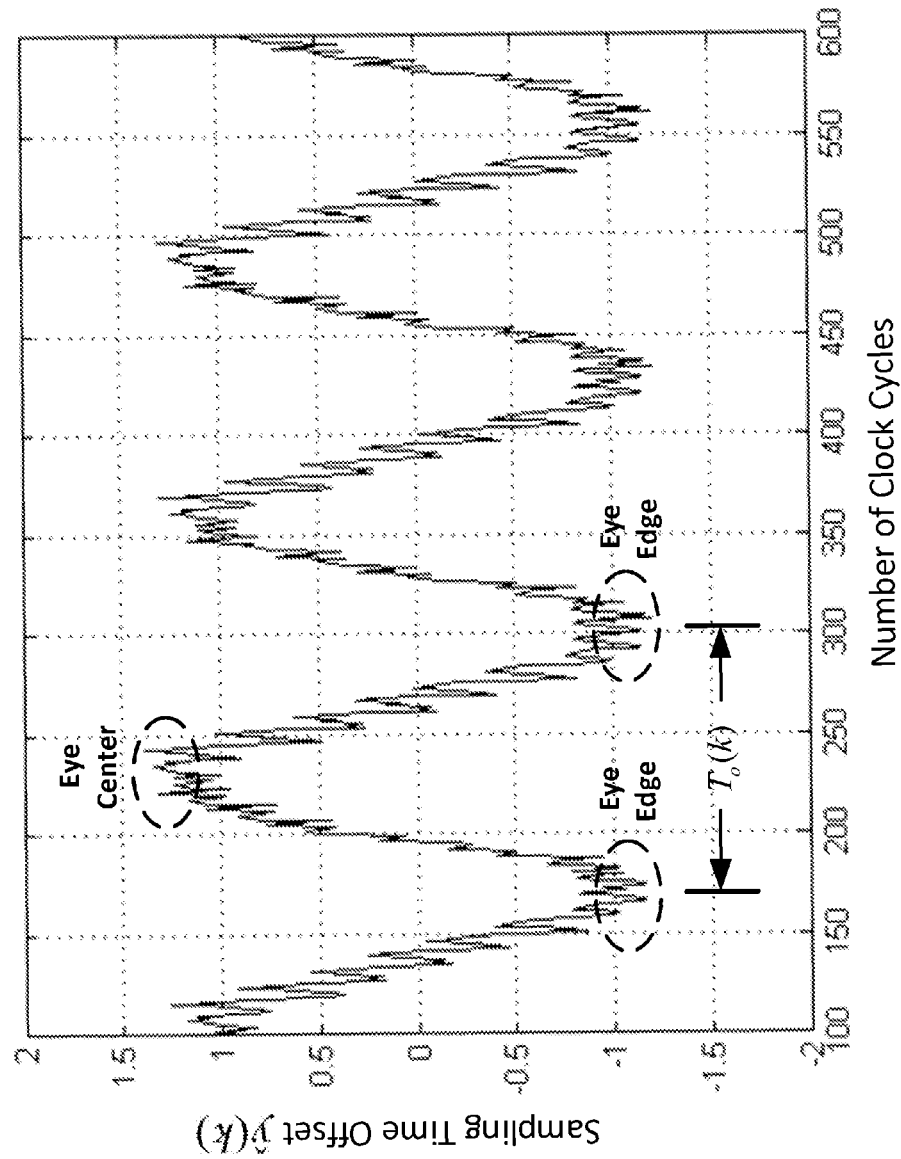
FIG. 8 is a signal diagram illustrating one method of estimating FO magnitude.

One method of estimating FO magnitude is illustrated in FIG. 8. The instantaneous FO magnitude is computed based on the time it takes for the sampling clock edge to transition from an eye edge to an eye center and then to the opposite eye edge. Assume a center sampling event, i.e., $I_c(k_1)$=1, is detected in-between two edge sampling events, i.e., $k_0$<$k_1$<$k_2$ and $I_e(k_0)$=$I_e(k_2)$=1, as shown in FIG. 8. In such case, an estimate of FO magnitude is given by:

$$m(k) = |f_o(k)| = \frac{1}{T_o(k)} = \frac{1}{(k_2 - k_o)T_c} \quad (15)$$

where $f_o(k)$ is the instantaneous FO, $T_o(k)$ denotes instantaneous FO period, ($k_2$-$k_0$) is the number of clock cycles between two edge-sampling events $I_e(k_0)$ and $I_e(k_2)$, and $T_c$ is the period of operating clock of FO detector.

Accordingly, the required frequency adjustment $f_a(k)$ is given by:

$$f_a(k) = -\beta \hat{s}(k) m(k) \quad (16)$$

where constant μ, i.e., 0<β≤1, is the step size of FO correction.

In one embodiment, the frequency regulator is activated upon a determination that the sampling clock edge sweeps through the eye of the incoming signal. The frequency regulator becomes inactive after frequency lock since the sampling clock edge no longer sweeps the signal eye after frequency lock. Upon the completion of frequency acquisition, both frequency tracking and phase tracking are fully under the control of a clock recovery loop. The decoupling of frequency acquisition from jitter tracking enables wide-range fast-lock frequency acquisition and meanwhile maintains a clock recovery loop optimized for jitter tolerance.

Figure 9:
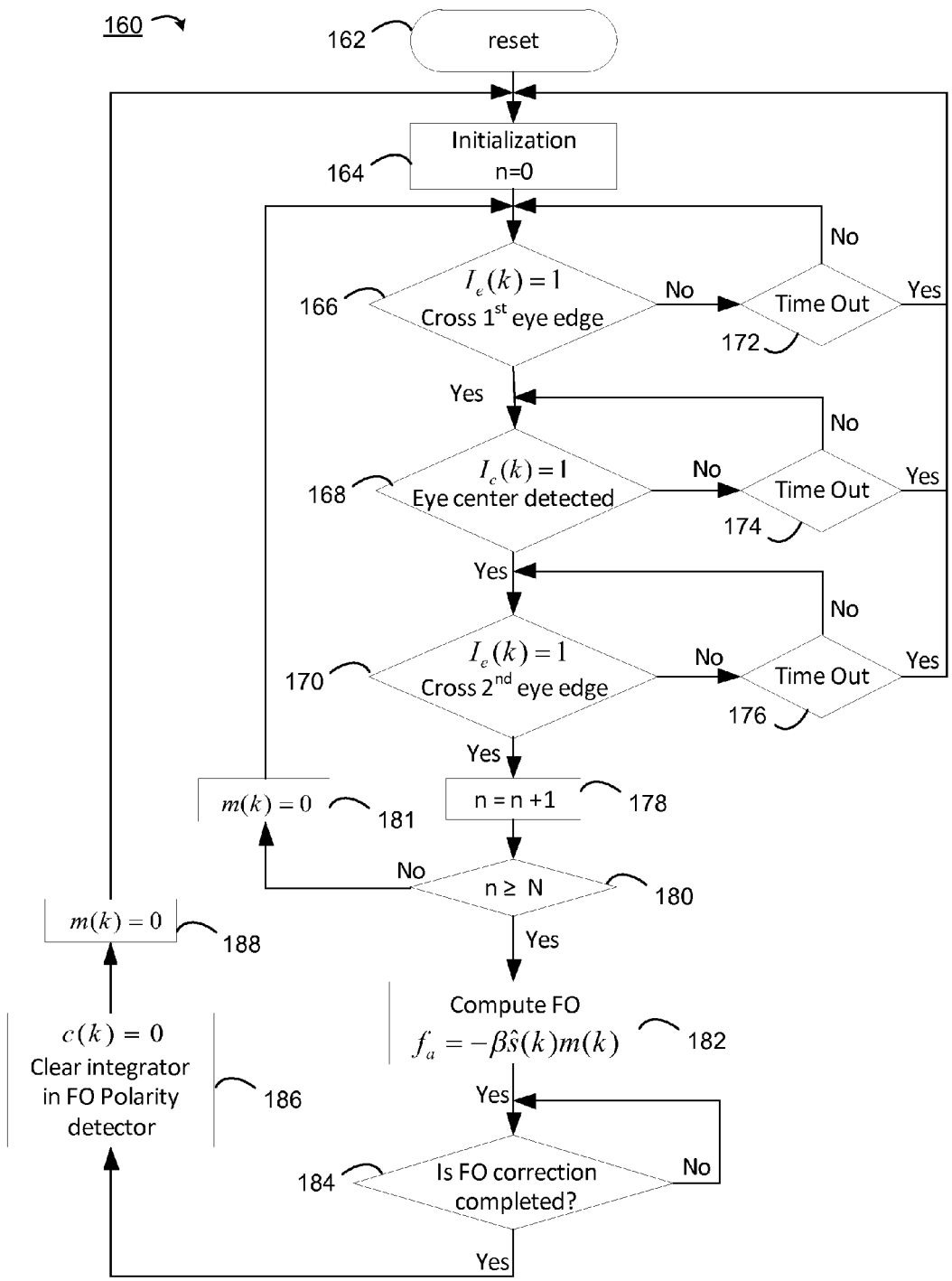
FIG. 9 is a flowchart illustrating one embodiment of a control process of a frequency regulator.

One control process 160 of frequency regulator performed by a finite state machine (FSM) is illustrated in FIG. 9. The process 160 begins from reset (state 162) and a counter n is reset to n=0 (step 164). Edge-crossing and centre-crossing events are detected and monitored. Thus, if a first edge-crossing event is asserted (decision 166), then the subsequent edge-crossing events are ignored and the frequency regulator enters into a state of waiting for a centre-crossing event. If a centre-crossing event is asserted (decision 168), then the frequency regulator enters into a state waiting for an edge-crossing event again (decision 170). In case of timeout while waiting for the first edge-crossing event, the centre-crossing event, or the second edge-crossing event (decisions 172, 174, 176, respectively), the FSM of frequency regulator transitions back to the initialization state (step 164). This process of looking for transitions from an eye edge to an eye center and then to the opposite eye edge can be repeated for N times, and thus following each edge-center-edge detection, counter n may be incremented (step 178) until n≥N (decision 180). In one embodiment, N=2 to increase the robustness of frequency acquisition during electrical idle or in the presence of invalid incoming data. With each iteration until n≥N, the FO magnitude estimate m(k) is reset m(k)=0 (step 181) before returning to initialization state (step 164).

Once n≥N, the FO magnitude is computed based on the average number of clock cycles it takes for sampling clock edge to transition from one eye edge to its opposite eye edge. Accordingly, the corresponding frequency correction signal $f_a(k)$ for the recovered clock is then generated (step 182). The frequency regulator stays at frequency adjustment state until the adjustment of the recovered clock is completed (step 184). Upon the completion of the frequency adjustment, signal c(k) is asserted to clear the integrator output in the FO polarity detector (step 186) and FO magnitude estimate m(k) is reset m(k)=0 (step 188) before returning to initialization state (step 164).

Figure 10:
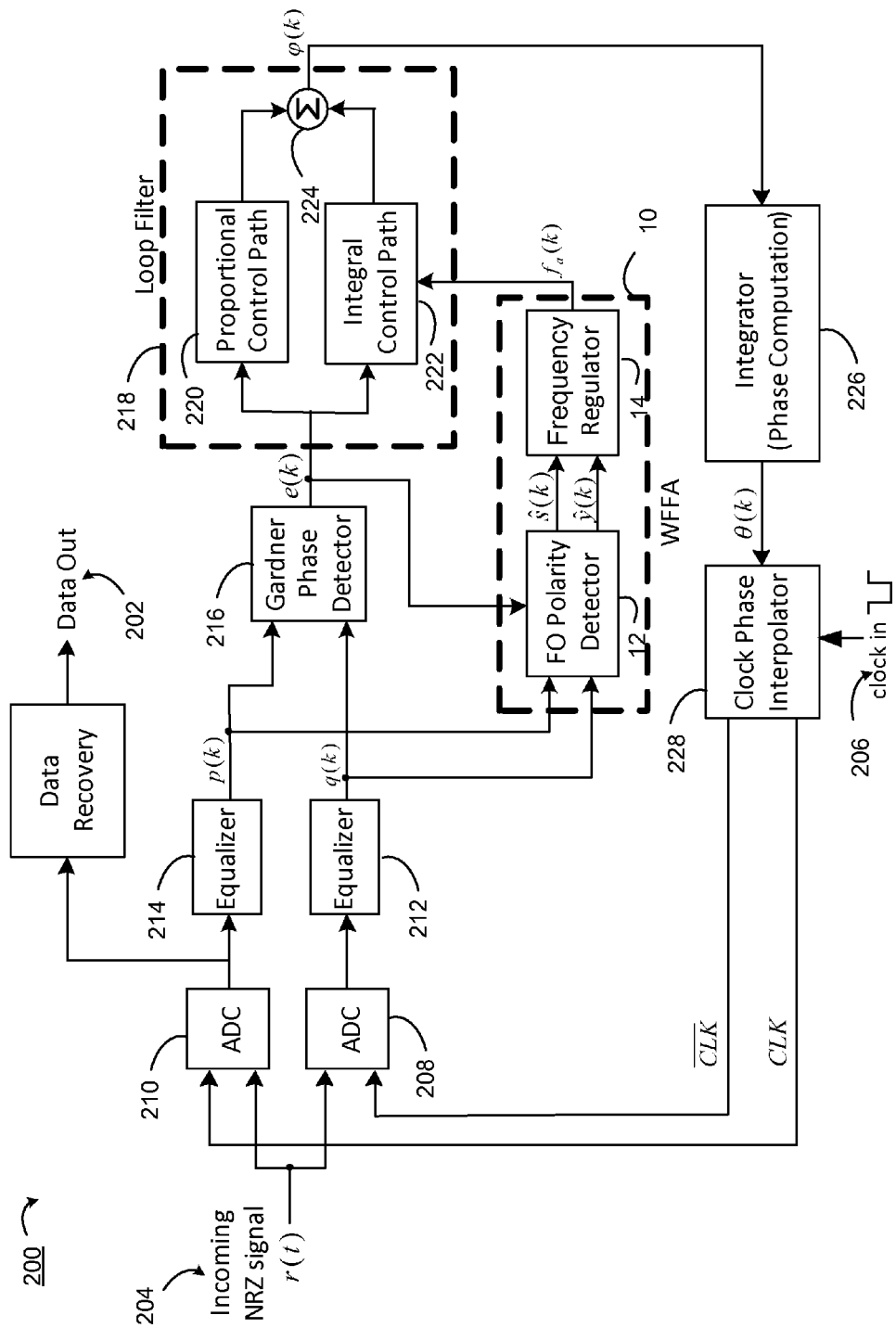
FIG. 10 is a schematic diagram of one embodiment of a CDR system incorporating the WFFA apparatus of FIG. 1.

FIG. 10 shows one embodiment of a CDR system 200 incorporating a WFFA apparatus 10, which may be used in serializer/deserializer (SerDes) applications, though it will be appreciated that the technique can be extended to other systems. The system 200 cooperates with a receiver to recover data 202 from an incoming NRZ signal 204 without a common reference clock between the NE receiver and an FE transmitter.

The CDR system 200 has a clock recovery loop and a data recovery subsystem. The clock recovery loop controls local sampling clocks 206 such that the sampling clock edges of CLK and $\overline{\text{CLK}}$ are aligned with the eye center and eye edge, respectively, of incoming NRZ signal r(t). The incoming NRZ signal r(t) 204 is sampled by two sets of analog-to-digital converters (ADCs) 208, 210. One set of ADCs 208, clocked with CLK, is used to obtain data samples. The data samples obtained are fed into data recovery subsystem for the detection of information bits transmitted from FE. The other set of ADCs 210 clocked with $\overline{\text{CLK}}$ is used to obtain timing samples. In the clock recovery loop, both data samples and timing samples are equalized using equalizers 212 and 214, respectively, to compensate inter-symbol interference. The equalized signals p(k) and q(k) are used by a Gardner phase detector 216 to detect the phase error between the sampling clock edge relative to an eye center. The detected phase error together with the equalized signals p(k) and q(k) are used by a FO polarity detector 12 to detect FO polarity ŝ(k) and sampling time offset ŷ(k). The obtained signals ŝ(k) and ŷ(k) are then fed into frequency regulator 14 to estimate the amplitude of frequency offset and correction value $f_a(k)$ during initial frequency acquisition. In parallel to the WFFA 10, a conventional loop filter 218 is used to filter phase error detected. It includes a proportional control path 220 and an integral control path 222 to track the phase and frequency change of incoming NRZ signals, respectively. The frequency correction signal $f_a(k)$ at WFFA 10 output is fed into the integral control path 222, namely, frequency control path, in the loop filter 218 to regulate the frequency of recovered sampling clock. The outputs of the proportional path 220 and integral control path 222 in the loop filter 218 are then combined by addition operation 224 to form an instantaneous phase correction signal φ(k) for data sampling clock, i.e., CLK. Signal φ(k) is fed into an integrator 226. The output of the integrator 226, i.e., θ(k), is the desired instantaneous sampling phase of sampling clock edge for data sampling clock CLK. It is used by phase interpolator 228 to generate the recovered clocks CLK and $\overline{CLK}$ for the sampling of data samples and timing samples, respectively.

Employment of the WFFA enables wide-range fast-lock frequency acquisition without compromising jitter tolerance. In addition, use of the WFFA speeds up frequency lock and frees up precious time during initial frequency acquisition. The WFFA can detect frequency lock status, prevent false frequency lock and frequency runaway. Lastly, use of the WFFA simplifies system design and integration by enabling a common frequency acquisition circuit for multiple industry standards with wide-range frequency offset. Dynamic adjustment of frequency tracking ranges based on rates, modes, SSC and jitter profiles, electrical idle, etc. is no longer required.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method of determining a frequency offset between a reference clock frequency of a receiver and a transmit clock frequency embedded in a received non-return to zero (NRZ) signal, the method comprising:
   determining a polarity of the frequency offset based on a moving direction of a sampling clock edge relative to an edge of a signal eye of the received NRZ signal and a region of the signal eye containing the sampling clock edge, wherein the polarity of the frequency offset is determined based on a correlation between indications of the moving direction of the sampling clock edge and corresponding indications of the signal eye region containing the sampling clock edge; and
   determining a magnitude of the frequency offset based on a time taken by the sampling clock edge to sweep the signal eye.

2. The method according to claim 1, wherein the signal eye region indications are generated based on phase errors of the received digital signal.

3. The method according to claim 2, wherein the phase errors are generated by a Gardner phase detector.

4. The method according to claim 1, wherein the moving direction indications are generated based on center-sampling indications indicating that data samples are sampled at a center of the signal eye, and edge-sampling indications indicating that data samples are sampled at an edge of the signal eye, wherein the center-sampling indications and the edge-sampling indications are generated from samples of the received digital signal.

5. The method according to claim 4, wherein the samples of the received digital signal comprise data samples p(k) and timing samples q(k), each timing sample q(k) leading a respective data sample p(k) by one-half of a unit interval of the data samples p(k), wherein k is a discrete time index.

6. The method according to claim 5, wherein the center-sampling indications are generated when corresponding data samples p(k) and timing samples q(k) samples are related by:

$$\{\text{sign}[p(k-1)] \neq \text{sign}[p(k)]\}$$

$$\cap [|q(k)| < u|p(k)|]$$

$$\cap [|q(k)| < u|p(k-1)|]$$

and wherein edge-sampling indications are generated when corresponding data samples p(k) and timing samples q(k) samples are related by:

$$\{\text{sign}[q(k-1)] \neq \text{sign}[q(k)]\}$$

$$\cap [|p(k)| < u|q(k-1)|]$$

$$\Omega[|p(k)| < u|q(k)|],$$

wherein u is a scaling factor wherein 0<u≤1.

7. The method according to claim 4, wherein the moving direction of the sampling clock edge relative to the edge of the signal eye is either away from the signal eye edge or toward the signal eye edge.

8. A method of determining a frequency offset between a reference clock frequency of a receiver and a transmit clock frequency embedded in a received non-return to zero (NRZ) signal, the method comprising:
   determining a polarity of the frequency offset based on a moving direction of a sampling clock edge relative to an edge of a signal eye of the received NRZ signal and a region of the signal eye containing the sampling clock edge;

determining a magnitude of the frequency offset based on a time taken by the sampling clock edge to sweep the signal eye;

determining the time taken by the sampling clock edge to sweep the signal eye, wherein edge-crossing events of the sampling clock edge crossing the edge or an opposite edge of the signal eye are detected, and further wherein center-crossing events of the sampling clock edge crossing a center of the signal eye are detected, wherein determining the time taken by the sampling clock edge to sweep the signal eye comprises detecting a first edge-crossing event within a first time-out period, and then detecting a center-crossing event within a second time-out period, and then detecting a second edge-crossing event within a third time-out period, and determining a number of clock cycles between the first edge-crossing event and the second edge-crossing event.

9. A device for determining a frequency offset between a reference clock frequency of a receiver and a transmit clock frequency embedded in a received digital signal, the device comprising:

a frequency offset polarity detector configured to determine a polarity of the frequency offset based on a moving direction of a sampling clock edge relative to an edge of a signal eye of the received digital signal and a region of the signal eye containing the sampling clock edge, wherein the frequency offset polarity detector comprises a polarity decision circuit configured to determine the polarity of the frequency offset based on a correlation between indications of the moving direction of the sampling clock edge and corresponding indications of the signal eye region containing the sampling clock edge; and a frequency offset regulator configured to determine a magnitude of the frequency offset based on a time taken by the sampling clock edge to sweep the signal eye.

10. The device according to claim 9, wherein the polarity decision circuit is configured to generate the signal eye region indications based on phase errors of the received digital signal.

11. The device according to claim 10, wherein the phase errors are received from a Gardner phase detector.

12. The device according to claim 9, wherein the frequency offset polarity detector further comprises an edge-center sampling detector configured to generate center-sampling indications and edge-sampling indications from samples of the received digital signal, and wherein the polarity decision circuit is further configured to generate the moving direction indications based on the center-sampling indications and edge-sampling indications received from the edge-center sampling detector.

13. The device according to claim 12, wherein the samples of the received digital signal comprise data samples $p(k)$ and timing samples $q(k)$, each timing sample $q(k)$ leading a respective data sample $p(k)$ by one-half of a unit interval of the data samples $p(k)$, wherein k is a discrete time index.

14. The device according to claim 13, wherein the center-sampling indications are generated when corresponding data samples $p(k)$ and timing samples $q(k)$ are related by:

$\{\text{sign}[p(k-1)] \neq \text{sign}[p(k)]\}$ $\cap [|q(k)| < u|p(k)|]$ $\cap [|q(k)| < u|p(k-1)|]$ and wherein edge-sampling indications are generated when corresponding data samples $p(k)$ and timing samples $q(k)$ samples are related by:

$\{\text{sign}[q(k-1)] \neq \text{sign}[q(k)]\}$ $\cap [|p(k)| < u|q(k-1)|]$ $\Omega [|p(k)| < u|q(k)|]$, wherein u is a scaling factor wherein $0 < u \leq 1$.

15. The device according to claim 12, wherein the moving direction of the sampling clock edge relative to the edge of the signal eye is either away from the signal eye edge or toward the signal eye edge.

16. A device for determining a frequency offset between a reference clock frequency of a receiver and a transmit clock frequency embedded in a received digital signal, the device comprising:

a frequency offset polarity detector configured to determine a polarity of the frequency offset based on a moving direction of a sampling clock edge relative to an edge of a signal eye of the received digital signal and a region of the signal eye containing the sampling clock edge; and a frequency offset regulator configured to determine a magnitude of the frequency offset based on a time taken by the sampling clock edge to sweep the signal eye, wherein the frequency offset regulator is configured to detect edge-crossing events of the sampling clock edge crossing the edge or an opposite edge of the signal eye and further to detect center-crossing events of the sampling clock edge crossing a center of the signal eye are detected, and further to determine the time taken by the sampling clock edge to sweep the signal eye based on the edge-crossing events and center-crossing events, wherein the frequency offset regulator comprises a frequency regulator finite state machine (FSM) configured to determine the time taken by the sampling clock edge to sweep the signal eye, wherein the frequency regulator FSM detects a first edge-crossing event within a first time-out period, and then detects a center-crossing event within a second time-out period, and then detects a second edge-crossing event within a third time-out period, and determines a number of clock cycles between the first edge-crossing event and the second edge-crossing event.

* * * * *